United States Patent
Chiou et al.

(10) Patent No.: US 9,570,331 B2
(45) Date of Patent: Feb. 14, 2017

(54) WAFER CASSETTE WITH ELECTROSTATIC CARRIER CHARGING SCHEME

(71) Applicant: Taiwan Semiconductor Manufacturing Company, Ltd., Hsin-Chu (TW)

(72) Inventors: Wen-Chih Chiou, Zhunan Township (TW); Yung-Chi Lin, Su-Lin (TW); Yu-Liang Lin, Hsin-Chu (TW); Hung-Jung Tu, Hualien (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 177 days.

(21) Appl. No.: 14/447,483

(22) Filed: Jul. 30, 2014

(65) Prior Publication Data

US 2016/0035609 A1 Feb. 4, 2016

(51) Int. Cl.
*H01L 21/673* (2006.01)
*H01L 21/683* (2006.01)

(52) U.S. Cl.
CPC ... *H01L 21/67383* (2013.01); *H01L 21/67386* (2013.01); *H01L 21/6831* (2013.01)

(58) Field of Classification Search
CPC .......... H01L 21/6735; H01L 21/67383; H01L 21/67386
See application file for complete search history.

(56) References Cited

U.S. PATENT DOCUMENTS 6,591,162 B1 * 7/2003 Martin .............. H01L 21/67379
700/225
2015/0187622 A1 * 7/2015 Johnson .............. H01L 21/6833
438/464

OTHER PUBLICATIONS

Landesberger, C. et al., "Electrostatic wafer handling for thin wafer processing," 2009 Microelectronics and Packaging Conference, European EMPC 2009, Jun. 15-18, 2009, pp. 1-5.

* cited by examiner

Primary Examiner — Gerald McClain
(74) Attorney, Agent, or Firm — Slater Matsil, LLP

(57) ABSTRACT

A wafer cassette includes a main body having space to hold at least one wafer assembly. Each of the at least one wafer assembly includes a wafer and an electrostatic carrier attached to the wafer. An electrical contact structure inside the main body is arranged to contact an electrical pad of the electrostatic carrier.

20 Claims, 8 Drawing Sheets

WAFER CASSETTE WITH ELECTROSTATIC CARRIER CHARGING SCHEME

BACKGROUND

Integrated circuits (ICs) are formed on semiconductor wafers. The semiconductor wafers are then sawed into chips. The fabrication of integrated circuits includes many process steps such as deposition, chemical mechanical polish (CMP), plating, and the like. Accordingly, wafers are transported between different fabrication tools for different process steps.

A challenge faced by integrated circuit manufacturing industry is that to improve cost efficiency, wafers become increasingly larger. In the meantime, wafers also have become thinner. Furthermore, in the manufacturing of integrated circuits, wafers may need to be thinned. For example, in the 3DIC technology, wafer thinning is used to thin down wafers to expose through-substrate vias (TSVs) formed therein, where the TSVs are important components for wafer/die stacking. However, handling such thin wafers is not easy. For example, the thin wafers may suffer from breakage, during the transportation and some processes, during which mechanical stress may be applied to the wafers.

To reduce the likelihood of breakage during transportation or a process, thin wafers may need to be strengthened. For example, a thin wafer is strengthened by bonding to a carrier. Therefore, the wafer can be supported mechanically by the carrier. After the process finishes, the wafer is de-bonded from the carrier. Such a temporary carrier has also become an important part to enable 3DIC development because both the front side and the back side of the wafer need to be processed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
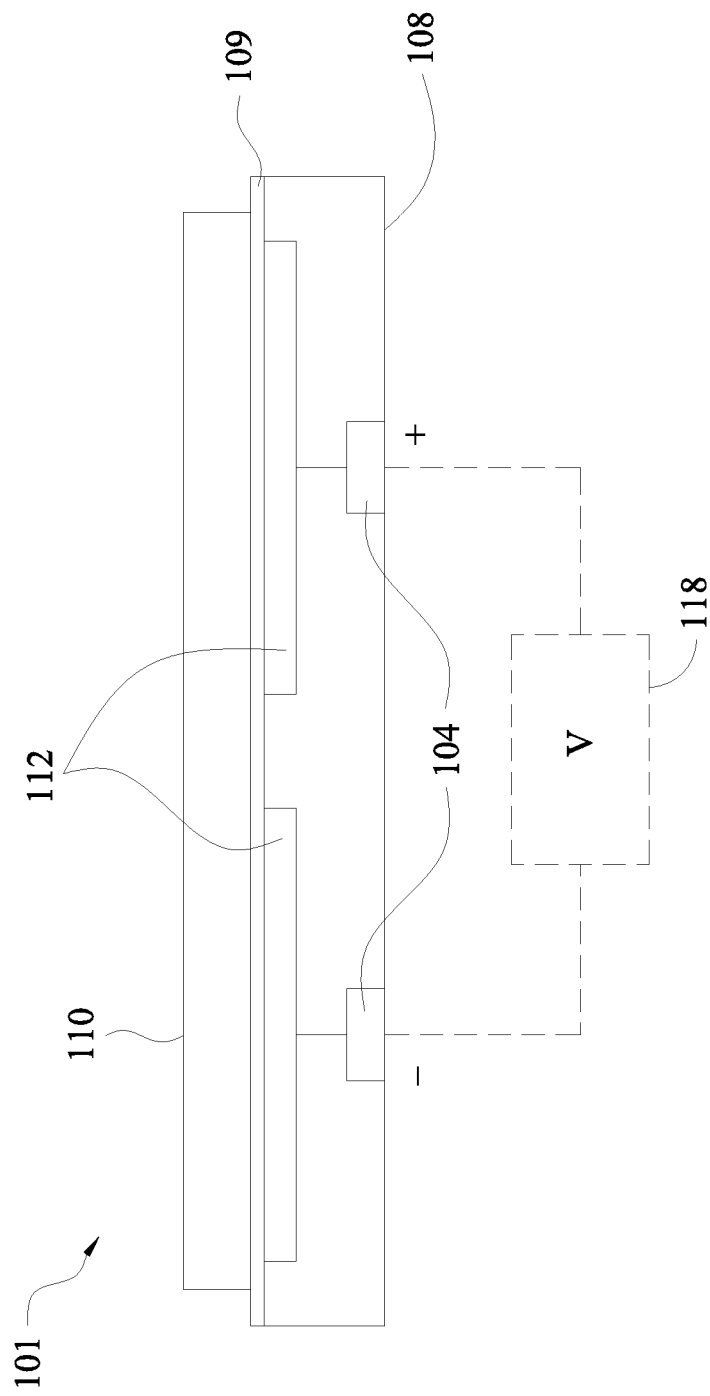
FIG. 1A illustrates an electrostatic carrier according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The method and structure described below can be applied to any wafer, including both thin and thick wafers or sawed dies. In the description below, thin wafers are used for illustrating purposes in some embodiments, but the method and structure disclosed herein are not limited to thin wafers.

Manufacturing technologies for thin wafers, e.g., having a thickness from about 50 μm to about 150 μm in some embodiments, have been used for a wide variety of microelectronic products. Among them, power devices, discrete semiconductors, opto-electronic components, 3DIC, and integrated circuits for radio-frequency identification (RFID) systems represent some of the applications. Further technological developments are targeting stacked-die assemblies, vertical system integration, and many new structures in the field of micro electro-mechanical systems (MEMS) devices.

If an adhesive bonding layer is used between the carrier and the wafer for bonding, there are limitations on what processes such wafer-supporting method can be used. For example, the bonding method may not be used in various manufacturing processes such as those requiring elevated temperatures because of the adhesive layer's endurance issue under the elevated temperatures. Further, in processes involving chemicals, for example, in wet etching processes, the adhesive layer may be attacked by the chemicals. Therefore, the usage of such method can be limited in some fabrication processes. Also, after the adhesive layer is removed, the wafer might need to be cleaned. For the fabrication process using a temporary wafer carrier, new wafer handling techniques are described herein, including processes that have to be performed at both sides of the wafer substrates.

FIG. 1A illustrates an electrostatic carrier 108 according to some embodiments. A wafer assembly 101 including the electrostatic carrier 108 and a wafer 110 is shown. The electrostatic carrier 108 is attached to the wafer 110 by the attraction from electrostatic charges. The wafer 110 and the electrostatic carrier 108 may be transported and used in various process steps as a single unit. The electrostatic carrier 108 provides mechanical support for the wafer 110 during these process steps.

The electrostatic mechanism for the temporary carrier is a cost effective method compared to the method using the adhesive bonding layer described above, because there is no need to form the adhesive layer between the carrier 108 and the wafer 110, to remove the adhesive layer, and to clean the wafer 110 afterwards. However, the electrostatic method may need recharging between fabrication processes with a long process cycle time and holding them between processes, due to the electrostatic force retention period. To maintain the electrostatic charges, the electrostatic carrier 108 is recharged between process steps in some embodiments.

As illustrated in the embodiment of FIG. 1A, at the front side of the electrostatic carrier 108, a pair of electrodes 112 is formed. The electrodes 112 are made of electrically conductive material, such as metal or any other suitable material. On top of the electrodes 112, one or more layers 109 of dielectric material such as silicon dioxide or any other suitable material are deposited, which allows both storage of charge carriers as well as electrical insulation at the wafer surface. The electrostatic carrier 108 in FIG. 1A is shown as an example, and any electrostatic carrier 108 having a different structure or shape can be used for the electrostatic carrier charging scheme disclosed herein.

A thin semiconductor wafer 110 can be placed on top of the electrostatic carrier 108, and then the electrodes 112 are charged by an external power supply 118 connected to electrical pads 104. The electrical pads 104 can have various shapes and also can be formed in a depression or hole to keep the surface flat on the back side of the electrostatic carrier 108 in some embodiments. The electrical pads 104 are connected to the electrodes 112, and can be disposed on the side, at the bottom, at the top of the electrostatic carrier 108, or any other suitable location of the electrostatic carrier 108 in some embodiments. The electrical pads 104 can be made of electrically conductive material, such as metal or any other suitable material.

The electrostatic carrier 108 is charged by using a power supply 118 with a direct current (DC) voltage with plus and minus terminals as shown in FIG. 1A in some embodiments. The resulting electrostatic fields provoke a separation of charge carriers (electrons and holes) at the backside of the semiconductor wafer 110 and thereby cause an attractive force between the electrostatic carrier 108 and the wafer 110. The charges can stay for some time period after the external power supply is removed, after which the charge could dissipate. The holding force depends on the dielectric constant of the dielectric layers 109 between the electrodes 112 and the wafer 110, the electrode 112 area, the distance between the electrode 112 and the wafer 110, and the applied voltage of the power supply 118. To discharge the electrostatic carrier 108, the contact pads of the electrostatic carrier 108 are shorted to neutralize the stored charges. Even though the wafer 110 is placed on top of the electrostatic carrier 108 in FIG. 1A, individual dies (chips) can be also placed on top of the electrostatic carrier 108 in some embodiments.

The base plate of the electrostatic carrier 108 can be made of different materials such as silicon, glass, ceramic, or any other suitable material, and also by different manufacturing technologies. For example, a thin film technology can be used to form the dielectric layer 109, electrodes 112, and electrical pads 104 on silicon or glass wafers, or a thick film technology on ceramic plates. The electrostatic carrier 108 is planar in order to accommodate its attachment to the wafer 110. The electrostatic carrier 108 may have a thickness of between about 550 µm and about 750 µm in some embodiments, such as about 620 µm. Additionally, the electrostatic carrier 108 has a diameter that is equal or greater than the wafer 110. Accordingly, while the size of the electrostatic carrier 108 will be in some ways dependent upon the size of the wafer 110, the carrier 108 may have a diameter that is greater than the diameter of the wafer 110 by a percentage ranging from about 0.3% to about 1% in some embodiments. For example, if the wafer 110 is about 300 mm in diameter, the electrostatic carrier 108 would be from about 301 mm to about 303 mm in diameter in some embodiments. However, other sizes or shapes of electrostatic carrier 108 are also possible.

Using silicon as the base material for the electrostatic carrier 108 plate offers several advantages: high thermal conductivity, the same coefficient of thermal expansion when thin silicon wafers are to be processed, full compatibility with common fab technology and the availability of a large variety of high-quality thin film layers. For a long duration time of electrostatic attraction requires good electrical insulation between the electrodes 112 and the thin wafer 110 and also between the electrodes 112 and the electrostatic carrier 108 substrate. High attractive forces can be achieved when the insulating layers such as the dielectric layer 109 are very thin. Thickness of dielectric layers 109 is in the range of about 2 µm to about 4 µm in some embodiments. In some embodiments, thin film technology on silicon wafer substrates is used with thermally grown oxide layers and plasma or chemical vapor deposition (CVD) deposited dielectric layers.

In some embodiments, the electrostatic carrier 108 is made of silicon as the base substrate, and a charging voltage of from about 100 V to about 300 V, such as 200 V, is applied from the power supply 118. The electrostatic attraction may remain active from about one hour at 400° C. to several days after the voltage supply is removed at room temperature in some embodiments. The holding properties depend on both the insulation properties of the electrostatic carrier 108 as well as on the mechanical properties of the thin wafer 110 attached, as well as environments such as humidity and temperature. Thin and flexible wafers come in close contact to the electrostatic carrier 108 and are thereby strongly attracted compared to a rigid/bent wafers or wafers with topographic patterns. In some embodiments, thin wafers have a thickness ranging from about 50 µm to about 150 µm. Wafers of different thickness are within the contemplated scope of the present disclosure, however. To discharge the electrostatic carrier 108, the contact pads 104 of the electrostatic carrier 108 are shorted to neutralize the stored charges in some embodiments.

The electrostatic carrier 108 may need recharging between fabrication processes with a long process cycle time and/or holding time between processes, due to expiration of the electrostatic force retention period. To maintain the electrostatic charges, the electrostatic carrier 108 is recharged between process steps in some embodiments.

Figure 1B:
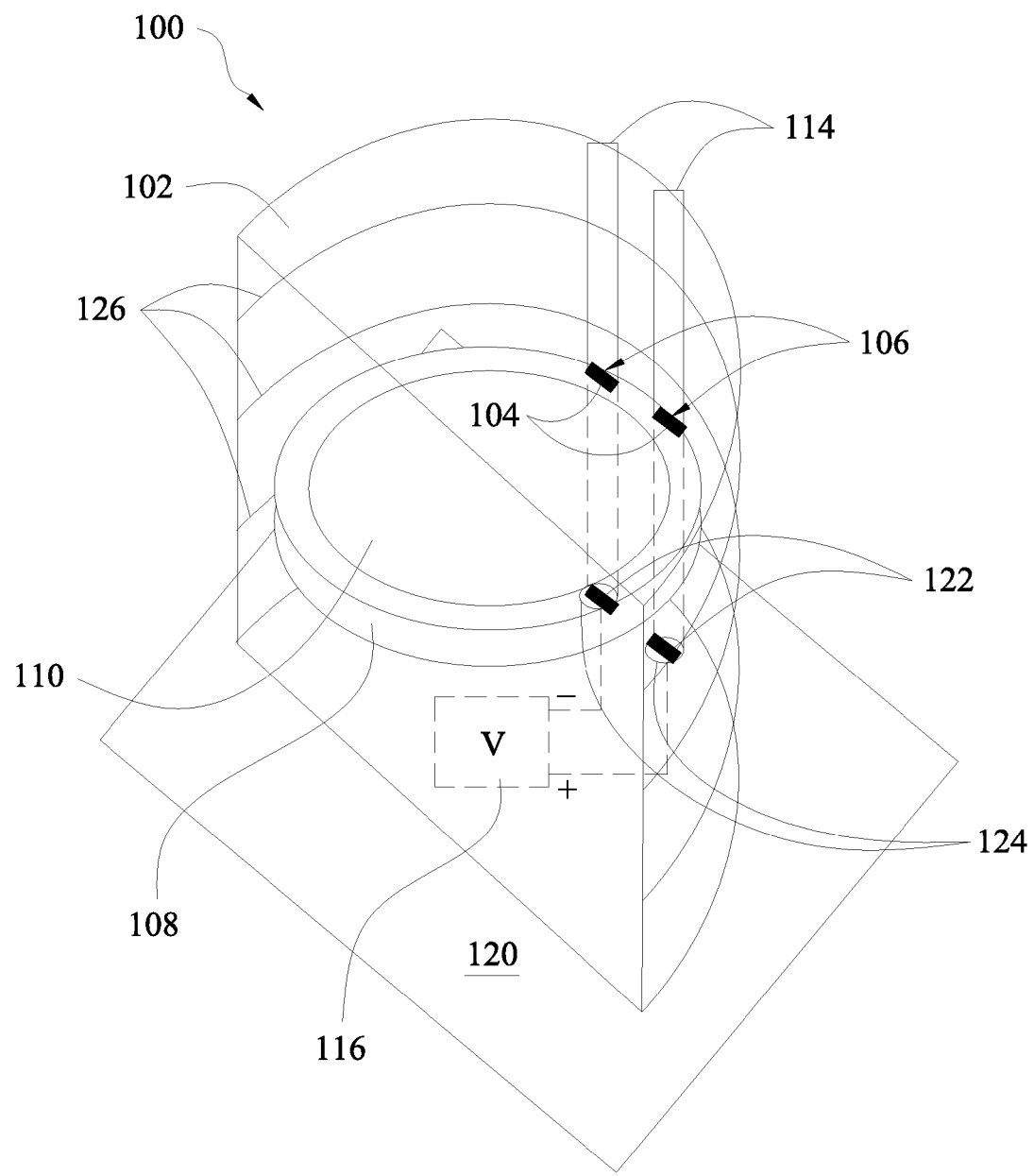
FIG. 1B illustrates a wafer cassette for an electrostatic carrier charging scheme according to some embodiments.

A wafer cassette 100 is shown in FIG. 1B, which includes a main body 102 having space to hold at least one wafer assembly 101. The wafer cassette 100 is also referred to as wafer carrier in the industry. Even though the wafer cassette 100 is described below, any wafer carrier, holder, cradle, or any similar container that can store, support, or hold at least one wafer for storage or transportation is intended to be included in this disclosure. Electrical contact structures 106 inside the main body 102 are arranged to contact electrical pads 104 of the electrostatic carrier 108, thus the locations of the electrical pads 104 and the electrical contact structures 106 are matched. The electrical contact structures 106 can be contact pins, contact pads, or any other electrical contact elements with suitable shapes. The electrical contact structures 106 can be made of electrically conductive material, such as metal or any other suitable materials with low resistivity. Also, the electrical contact structures 106 may have spring elements that provide tension for the electrical contact structures 106 to provide better electrical contacts and/or hold on the contact pads 104 of the electrostatic carrier 108.

Electrical contact structures 122 outside the main body 102 are arranged to provide an electrical contact on a wafer cassette stage 120. The wafer cassette stage 120 can be any suitable surface where the wafer cassette 100 can be placed and/or transported. The wafer cassette stage 120 also has electrical contact structures 124 that can provide electrical contacts between a power supply 116 and the wafer cassette 100 through the electrical contact structures 122 of the wafer cassette 100. The electrical contact structures 106 and 122 are connected such as by conductive wires, so that the power supply 116 connected to the wafer cassette stage 120 can provide recharging to the wafer assembly 101.

In some embodiments, there can be a sensor to switch the power supply 116 on/off. For example, an optical sensor or a pressure sensor can be used to confirm whether the wafer cassette 100 is placed on the wafer cassette stage 120 for recharging. The electrical contact structures 122 and 124 can be made of electrically conductive material, such as metal or any other suitable material. Even though the power supply 116 is connected to the wafer cassette stage 120 in FIG. 1B, the power supply 116 can be attached or included to the wafer cassette 100 in some other embodiments.

A pair of contact housings 114 for positive and negative terminal electrical connections is arranged inside the wafer cassette 100 so that the electrical pads 104 of the electrostatic carrier 108 can make electrical contacts with the electrical contact structures 106 of the wafer cassette 100. The polarity of the electrical contact structures 106 and electrical pads 104 of the electrostatic carrier 108 should be matched properly for recharging. The contact housings 114 may have depressions (e.g., 204 in FIG. 2B), channels, or grooves to hold the wafer assembly 101 in place to make the electrical contacts in some embodiments. The electrical contact structures 106 are attached to the contact housing 114 that provides space for electrical connections (such as for conductive wires) on the inside and depressions/slots for holding wafer assembly 101 on the outside in some embodiments. In some other embodiments, the contact housing 114 can be separate from the electrical contact structures 106. In some embodiments, the contact housings 114 are positioned at the back of the main body 102 and arranged to hold multiple wafer assemblies 101. In other embodiments, the contact housings 114 may be positioned at the side, the front, or any other suitable location of the main body 102 of the wafer cassette 100.

In some embodiments, the wafer cassette 100 has at least one wafer supporter 126 (not illustrated in detail) inside the main body 102 for wafer assembly 101 positioning. For example, the wafer supporters 126 can be fins or ridges separating multiple wafer assemblies 101 from each other, or partial shelves along the inside wall of the main body 100 that provide support for the wafer assembly 101. In some embodiments, the main body 102 of the wafer cassette 100 is made of material that comprises polymers such as polypropylene or any other suitable material. Even though the wafer cassette 100 is shown in a vertical position so that the wafer assembly 101 can be loaded horizontally, the wafer cassette 100 can be in a horizontal position so that the wafer assembly 101 can be loaded vertically in some embodiments.

Figure 2A:
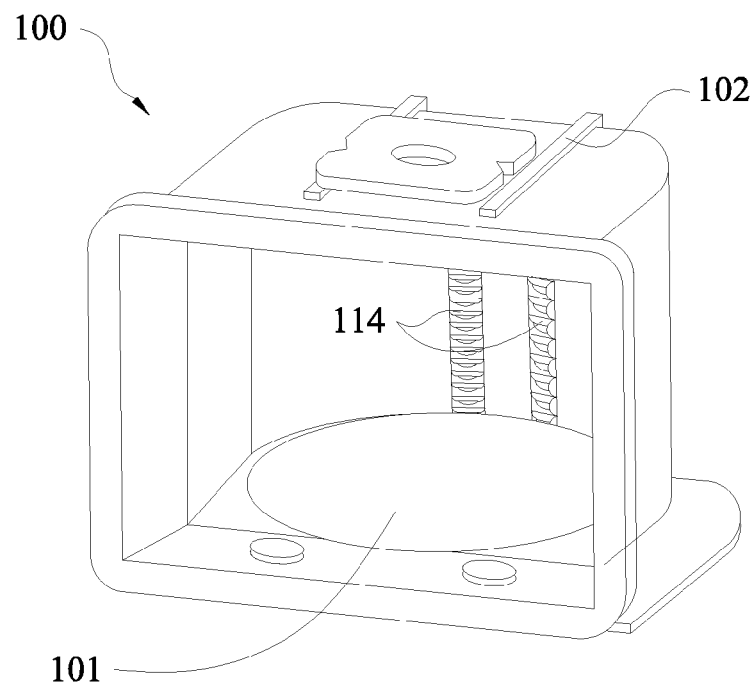
FIGS. 2A-2D illustrate the wafer cassette of FIG. 1 in more detail according to some embodiments.

FIGS. 2A-2D illustrate the wafer cassette 100 of Fig. 1B in more detail according to some embodiments. In FIG. 2A, the wafer cassette 100 comprises the main body 102 that has space to hold the wafer assembly 101 inside. A pair of contact housings 114 is located at the back of the wafer cassette 100. In other embodiments, the contact housing 114 can be located in different parts of the main body 102, such as on the side of the main body 102.

Figure 2B:
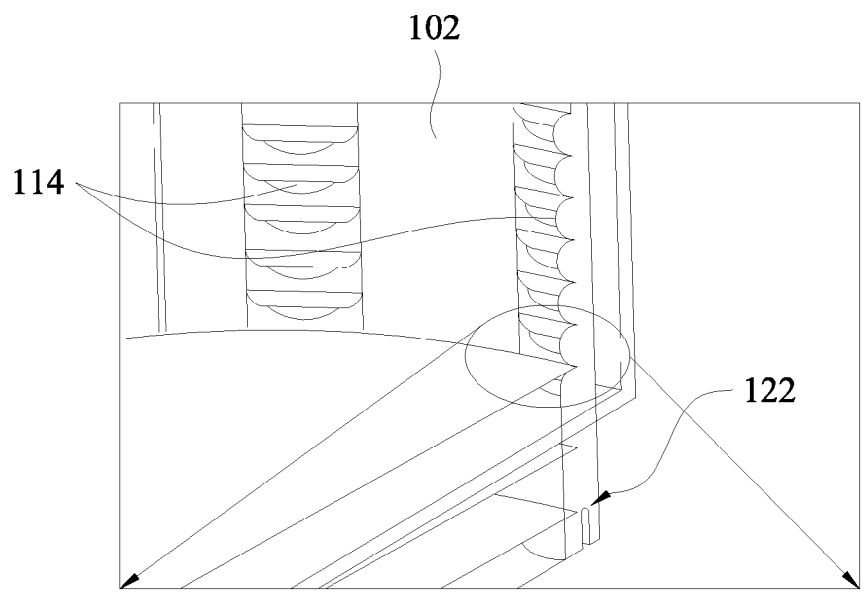
Figure 2C:
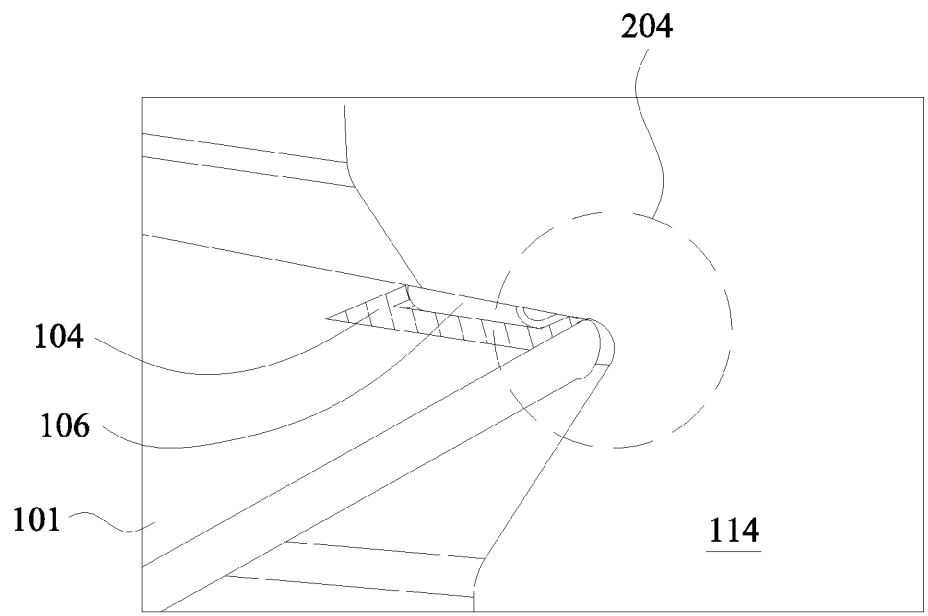

The contact housings 114 are shown in more detail in FIGS. 2B-2C. FIG. 2C is a magnified view of the circled portion of FIG. 2B. In some embodiments, the contact housings 114 have depressions 204 to hold the wafer assembly 101 in place to make contact with the electrical contact structures 106. Also, the electrical contact structures 106 may have spring elements that provide tension for the electrical contact structures 106 to make electrical contacts with and/or hold on the contact pads 104 (shown in FIG. 2C) of the electrostatic carrier 108. For example, the electrical contact structures 106 may be made of bendable electrically conductive material such as metal that has elasticity.

The electrical contact structures 106 are arranged to be connected to the power supply 116 (shown in FIG. 1B) when the wafer cassette 100 is placed on the wafer cassette stage 120. The wafer cassette stage 120 is separate from the wafer cassette 100, and can be stationary or mobile for transportation. The wafer cassette stage 120 can be used to hold, charge, and transport the wafer assembly 101 in the wafer cassette 100. The wafer cassette 100 has electrical contact structures 122 outside the main body 102 that are arranged to provide an electrical contact with the electrical contact structures 124 (shown in FIG. 1B) of the wafer cassette stage 120. The electrical contact structure 122 is attached to the contact housings 114 in some embodiments. The electrical contact structures 106 and 122 are connected so that when the power supply 116 is connected to the wafer cassette stage 120, the wafer assembly 101 can be charged from the power supply 116.

Figure 2D:
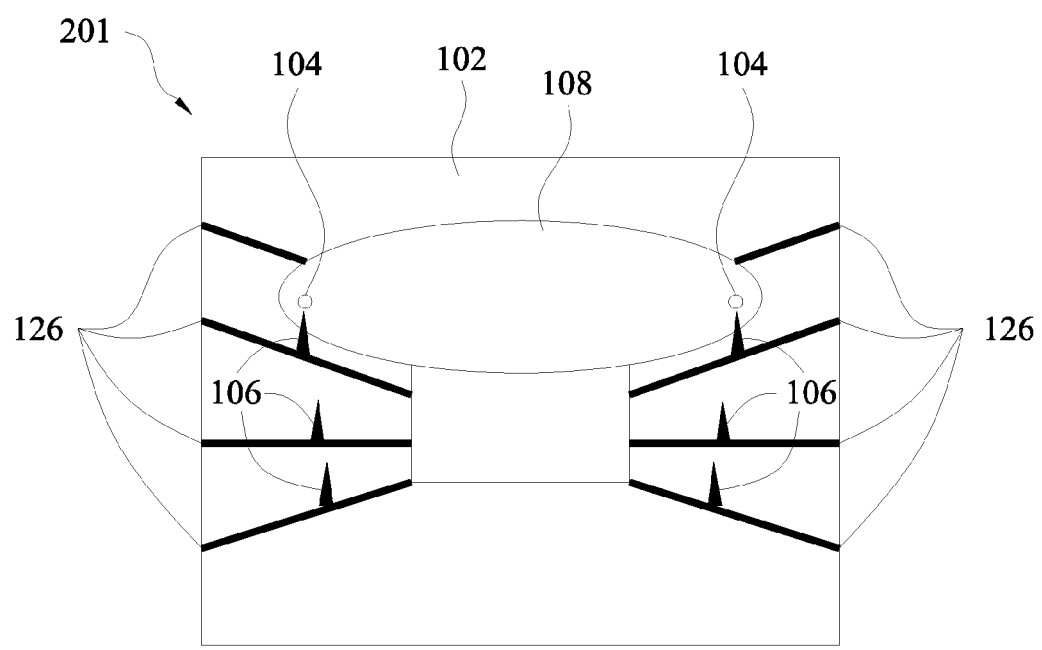

In FIG. 2D, a front inside view of another exemplary wafer cassette 201 is illustrated. The main body 102 has wafer supporters 126 inside, and electrical contact structures 106 are attached on the wafer supporters 126. The electrical contact structures 106 are electrically connected to the electrical contact structures 122 of FIG. 1B and are shown in a contact pin shape in this example. In other embodiments, the electrical contact structures 106 may have different shapes. When the wafer assembly 101 having the electrostatic carrier 108 attached to the wafer 110 is placed inside the wafer cassette 201, the electrical contact structures 106 are arranged to make electrical contact with the electrical pads 104 formed in a depression or hole on the back side of the electrostatic carrier 108. The electrical contact structures 106 may have spring elements that provide tension for the electrical contact structures 106 to help electrical contacts with the contact pads 104 on the back side of the electrostatic carrier 108 and/or hold the electrostatic carrier 108 in place.

Figure 3:
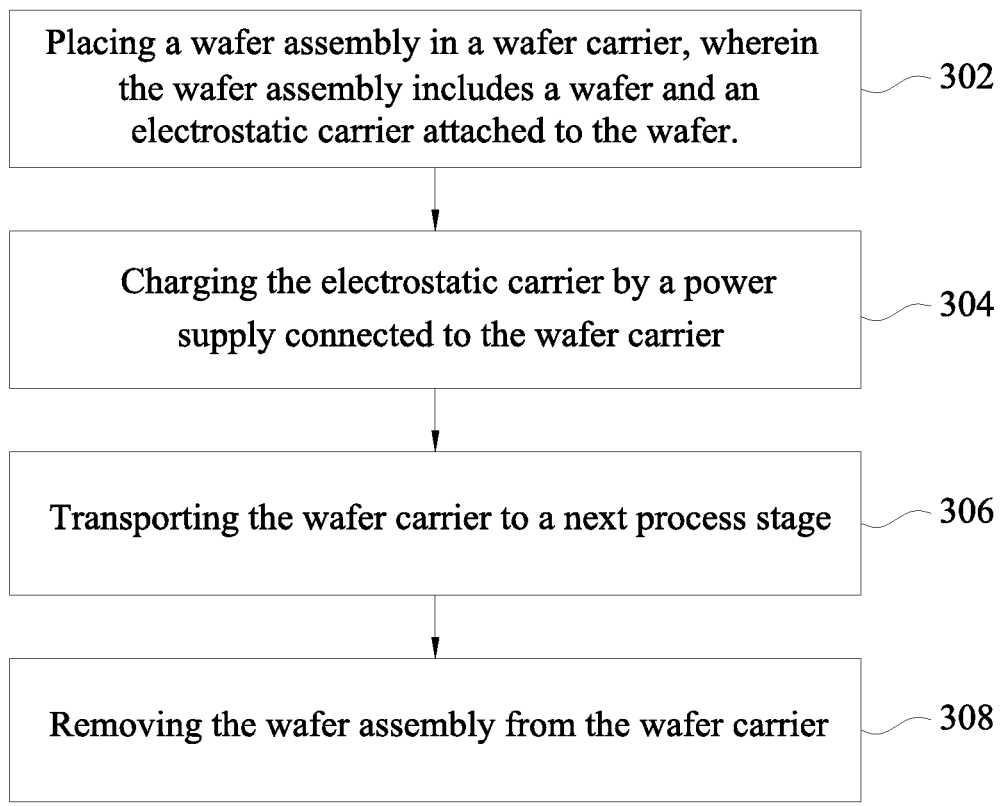
FIG. 3 is a flow diagram illustrating the method of electrostatic carrier charging scheme in FIG. 1 according to some embodiments.

FIG. 3 is a flow diagram illustrating the method of electrostatic carrier charging scheme in FIG. 1 according to some embodiments. At operation 302, a wafer assembly 101 is placed in a wafer cassette such as 100, or 201 in FIG. 1B, FIG. 2A, or FIG. 2C. The wafer assembly 101 includes a wafer 110 and an electrostatic carrier 108 attached to the wafer 110. At operation 304, the electrostatic carrier 108 is charged by a power supply 116 connected to the wafer cassette such as 100 or 201. In some embodiments, there can be a sensor to switch the power supply 116 on/off. For example, an optical sensor or a pressure sensor can be used to confirm whether the wafer cassette 100 is placed on the wafer cassette stage 120 for recharging. At operation 306, the wafer cassette such as 100, 200, or 201 is transported to a next process stage. In some embodiments, the electrostatic carrier 108 can be charged by a power supply 116 connected to the wafer cassette such as 100 or 201 while waiting for the next process. At operation 308, the wafer assembly 101 is removed from the wafer cassette such as 100 or 201 for the next processing. After the next processing, the operations from 302 to 308 can be repeated for a different wafer process operation.

As described above, the wafer assembly 101 is initially formed by receiving a wafer 110, placing the wafer 110 on the wafer cassette 108, and charging the wafer cassette 108 to attach the wafer 110 to the wafer cassette 108.

Figure 4A:
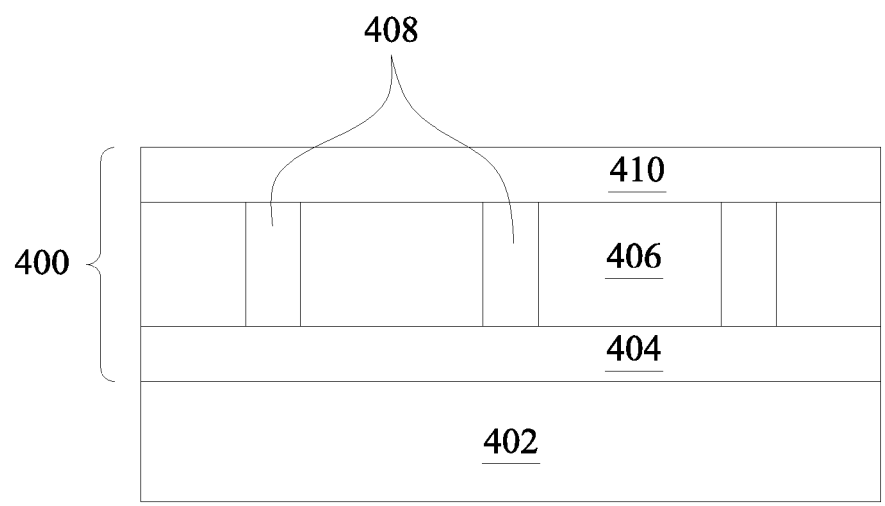
FIGS. 4A-4F illustrate an exemplary process flow that can use the electrostatic carrier charging scheme in FIG. 1 according to some embodiments.

FIGS. 4A-4F illustrate an exemplary process flow that can use the electrostatic carrier charging scheme in FIG. 1 according to some embodiments. In FIG. 4A, a semiconductor wafer 400 has a front side redistribution layer (FS RDL) 404, a substrate 406, a back side redistribution layer (BS RDL) 410, and through substrate vias (TSV) 408. Even though FS RDL 404, BS RDL 410, and TSV 408 are shown as representative features of the wafer 400, a person skilled in the art will understand that the wafer 400 may have many other features, devices, and layers formed in the wafer 400. For example, electronic devices, dielectric layers, and metal layers can be formed on the substrate 406.

There are various methods to form the TSVs 408 through the substrate 406. In some embodiments, the TSVs 408 are formed by initially forming conductive vias at least partially through the substrate 406. The conductive vias are formed by applying and developing a suitable photoresist (not shown), and then etching the front side of the substrate 406 to form via openings. The via openings may be formed so as to extend into the substrate 406 at least further than the electrical devices formed within and on the substrate 406, and at least to a depth greater than the eventual desired height of the dies. Accordingly, while the depth of the via openings from the surface of the substrate 406 is dependent upon the overall design of the dies, the depth may be between about 50 µm and about 200 µm in some embodiments, such as about 150 µm. Further, the via openings may have a diameter of between about 5 µm and about 100 µm, such as about 50 µm.

A barrier layer (not shown) may be formed along the sidewalls of the via openings. The barrier layer may comprise a conductive material such as titanium nitride, although other materials, such as tantalum nitride or titanium, may alternatively be utilized. The barrier layer may be formed using a CVD process, such as plasma-enhanced chemical vapor deposition (PECVD). However, other alternative processes, such as sputtering or metal organic chemical vapor deposition (MOCVD), may alternatively be used.

The via openings are then filled with a conductive material. The conductive material may be formed through an electro-deposition process and may comprise copper. However, other suitable methods, such as electroless deposition, plating, or CVD, and other suitable materials, such as tungsten, may alternatively be used to form the conductive material. In an embodiment, the conductive material completely fills and overfills the vias openings, and excess conductive material outside of the via openings may be removed through a process such as grinding or etching in order to form the conductive vias. Afterwards, the FS RDL 404 can be formed over the conductive vias on the front side of the substrate 406 by photolithography and conductive material deposition using processes known in the art in some embodiments.

Once the conductive vias and FS RDL 404 have been formed, the substrate 406 with the FS RDL 404 can be mounted on an electrostatic carrier 402 for back side processing. As described previously, the substrate 406 with the FS RDL 404 can be mounted on the electrostatic carrier 402 in a charging station and a charging voltage of about 200 V can be applied from a power supply so that the electrostatic carrier 402 and the substrate 406 with the FS RDL 404 are attached in some embodiments.

After the substrate 406 with the FS RDL 404 is mounted on the electrostatic carrier 402, the back side of the substrate 406 may be thinned so as to expose the conductive vias, thereby forming TSVs 408. The thinning of the substrate 406 may be performed using a removal process such as chemical mechanical polishing (CMP), wherein a combination of etchant and abrasive are put into contact with the substrate 406 and a grinding pad (not shown) is used to thin the substrate 406. However, any suitable process for thinning the substrate 406, such as etching, may alternatively be used. After TSVs 408 are formed, the BS RDL 410 can be formed on the back side of the substrate 406 by photolithography and conductive material deposition using processes similar to the processes known in the art in some embodiments. FIG. 4A illustrates the structure after substrate 406 has been thinned and BS RDL 410 has been formed on the thinned back side.

The electrostatic carrier 402 is attached to the wafer 400 in order to provide structural support for the thinned wafer 400 during further processing. The electrostatic carrier 402 comprises, for example, silicon, glass, ceramic, any combinations of any of these materials, or any other suitable material. The electrostatic carrier 402 is planar in order to accommodate its attachment to the wafer 400. The electrostatic carrier 402 may have a thickness of between about 500 µm and about 750 µm in some embodiments, such as about 600 µm.

Additionally, the electrostatic carrier 402 may have a diameter that is greater than the wafer 400. Accordingly, while the size of the electrostatic carrier 402 will be in some ways dependent upon the size of the wafer 400, the electrostatic carrier 402 may have a diameter that is greater than the diameter of the wafer 400 by a percentage ranging from about 0.3% to about 1%. For example, if the wafer 400 is about 300 mm in diameter, the electrostatic carrier 402 would be from about 301 mm to about 303 mm in diameter in some embodiments.

Figure 4B:
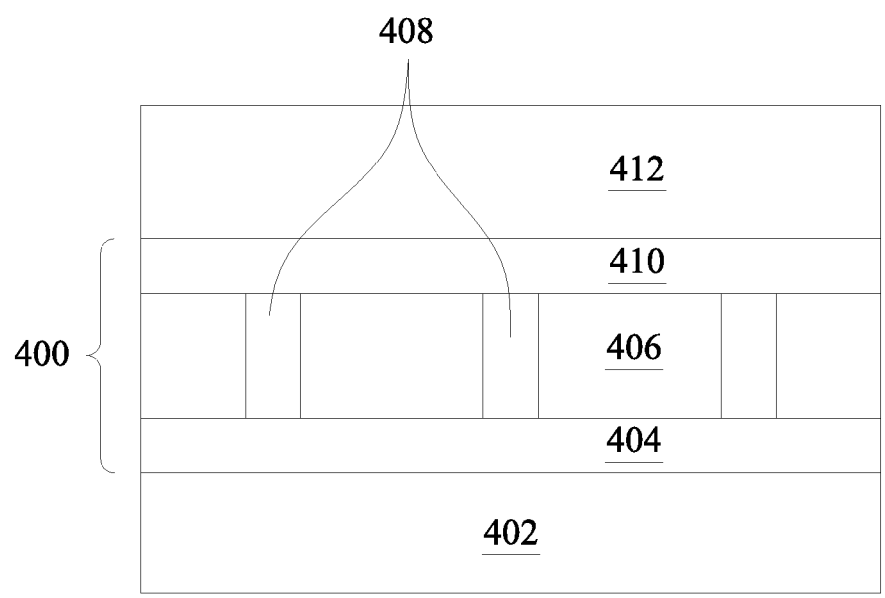
Figure 4C:
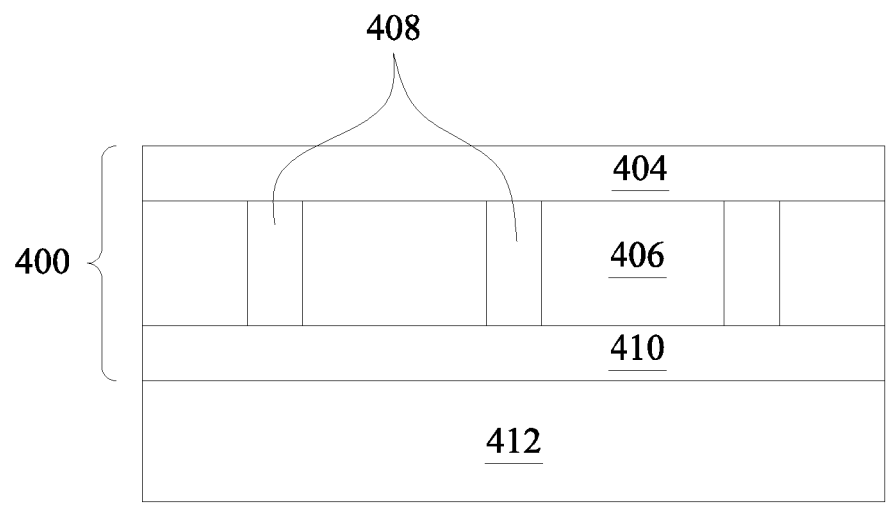

In FIG. 4B, another electrostatic carrier 412 is bonded on the back side of the wafer 400 for further processing. As described previously, the wafer 400 can be attached to the electrostatic carrier 412 in a charging station by charging with a voltage of about 200 V from a power supply in some embodiments In FIG. 4C, the electrostatic carrier 402 on the front side of the wafer 400 is de-bonded from the wafer 400 by discharging. In some embodiments, the contact pads of the electrostatic carrier 402 are shorted to neutralize the stored charges (i.e., to discharge). In some embodiments, functional test of the front side of the wafer 400 after de-bonding from the electrostatic carrier 402 can be performed before further processing.

After the electrostatic carrier 402 is removed, the wafer assembly including the wafer 400 and the electrostatic carrier 412 can be transferred to the next process stage by using a wafer cassette such as 100 or 201 in FIG. 1B, FIG. 2A, or FIG. 2D. While in transportation, the electrostatic carrier 412 can be recharged inside the wafer cassette such as 100 or 201 as described above. The electrical contact structures 104 and 106 in FIG. 1B, FIG. 2C, or FIG. 2D should be aligned properly and make electrical contacts when mounting the wafer assembly in the wafer cassette. By recharging the electrostatic carrier 412 while in transportation or waiting for the next process, the wafer 400 and the electrostatic carrier 412 do not need to be placed in a separate charging station again to recharge the electrostatic carrier 412, which saves time and cost.

Figure 4D:
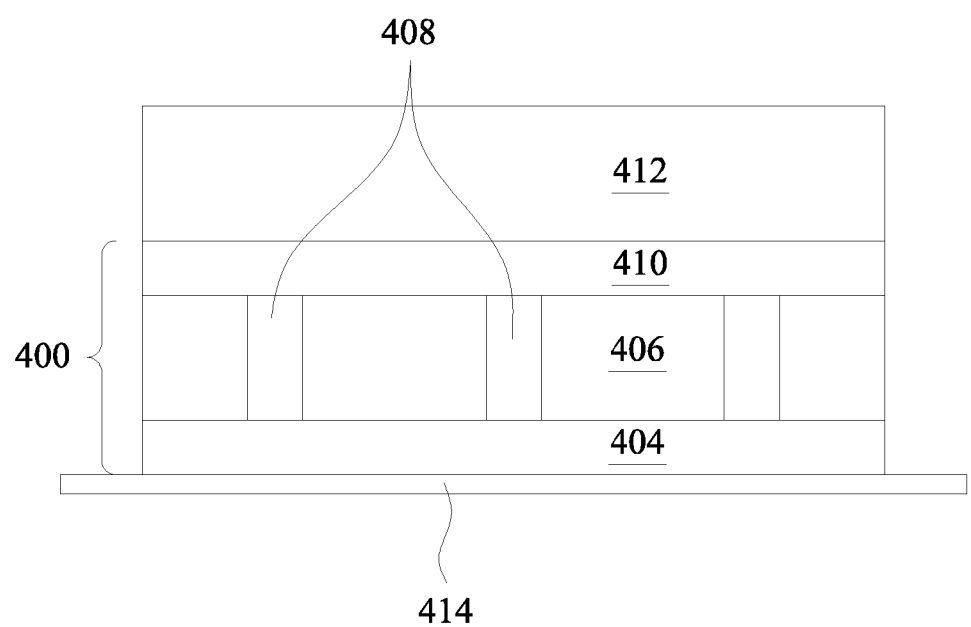
Figure 4E:
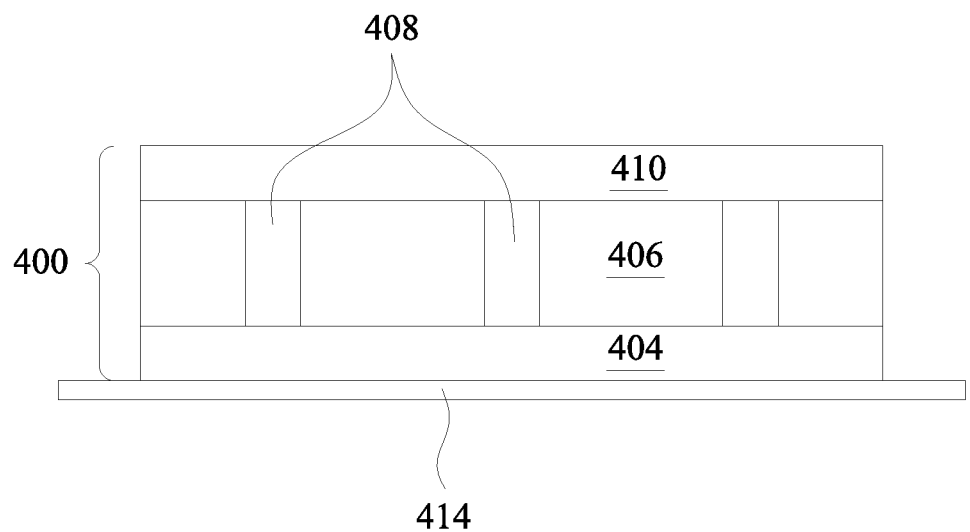
Figure 4F:
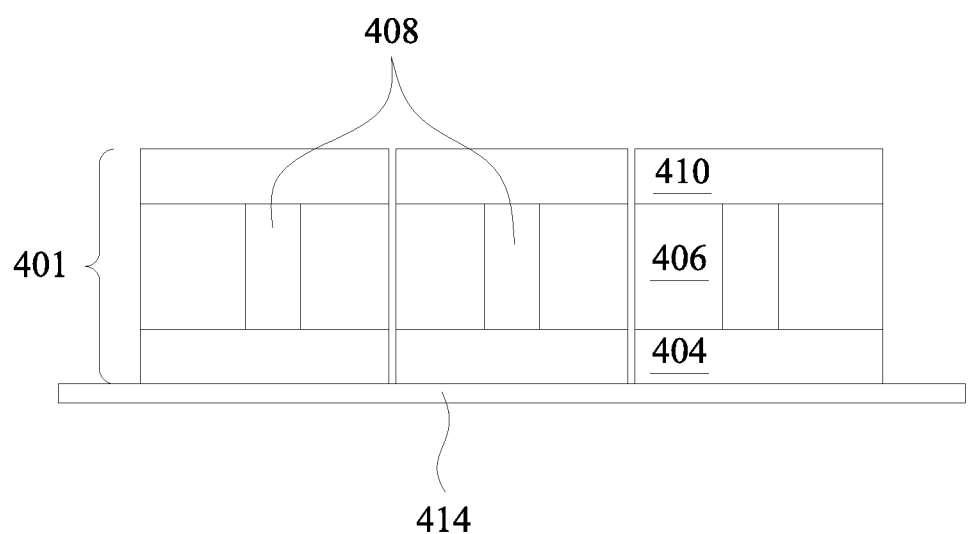

In FIG. 4D, the wafer 400 is flipped and attached to a dicing frame (or tape) 414. In FIG. 4E, the electrostatic carrier 412 is de-bonded by discharging. In between the FIGS. 4D and 4E, a normal wafer cassette without charging capability can be used to transport the wafer assembly including the wafer 400 and the electrostatic carrier 412. In FIG. 4F, the wafer 400 de-bonded from the electrostatic carrier 412 is diced into individual chips 401.

The process flow described above is an example, and there are many different fabrication processes that can use the wafer cassette with charging capability such as 100 or 201 in FIG. 1B, FIG. 2A, or FIG. 2C. The wafer cassette such as 100 or 201 can be used between fabrication process steps to strengthen the attachment between the wafer and the electrostatic carrier such as 108 in FIG. 1. While the wafer assembly 101 is transported in the wafer cassette such as 100 or 201, the electrostatic carrier 108 can be recharged. By using this method, multiple transportations of the wafer assembly 101 back and forth from a separate charging station to recharge the electrostatic carrier 108 can be avoided to save time and cost.

The electrostatic carrier 108 can be used in many process steps. For example, the electrostatic carrier 108 can be used during a plasma chamber process, dry etching of silicon, and PECVD deposition of silicon dioxide films at temperatures above 200° C., among other processes. Other processes using the electrostatic carrier 108 include photolithographic patterning for wafers. The electrostatic carrier 108 can be used to support thin silicon wafers during a hexamethyldisilazane (HMDS) coating and drying, spin-coating of resist, pre-bake and pattern definition by means of a mask aligner. Developing and stripping of photo resist can be also done by means of single wafer spin processors or combining electrostatic clamping with a re-workable sealing material applied along the wafer edge before chemical bath processes. Further, other possible applications in back end of line (BEOL) process sequences include manufacture of solder ball bumps including stencil printing of solder paste and subsequent reflow at 250° C. in a belt oven.

Even though the use of the wafer cassette such as 100 or 201 in FIG. 1B, FIG. 2A, or FIG. 2D is described above with the electrostatic carrier 108 attached to the wafer 110, electrostatic wafer handling is not restricted to full wafer substrates. In some other embodiments, single dies (chips) can also be reversibly attracted and securely handled by using the electrostatic carrier 108. Electrostatic carrier 108 can be also recharged using the wafer cassette such as 100 or 201 between fabrication process steps. For handling single dies, patterning of the electrodes 112 of the electrostatic carrier 108 may need to be designed such that the distance of two oppositely charged electrodes 112 is smaller than the die size in some embodiments.

In this disclosure, embodiments a wafer cassette are provided. The wafer cassette can hold a wafer assembly with a wafer mounted on an electrostatic carrier, and is configured to recharge the electrostatic carrier. The electrostatic carrier needs to be recharged periodically to ensure sufficient charges are available at the electrostatic carrier to be bound to the wafer. By recharging the electrostatic carrier while in transportation or waiting for the next process while sitting in the wafer cassette, the wafer assembly do not need to be sent to a designated charging station to recharge the electrostatic carrier, therefore saves time and cost.

According to some embodiments, a wafer cassette includes a main body having space to hold at least one wafer assembly. Each of the at least one wafer assembly includes a wafer and an electrostatic carrier attached to the wafer. An electrical contact structure inside the main body is arranged to contact an electrical pad of the electrostatic carrier.

According to some embodiments, a method includes placing a wafer assembly in a wafer cassette. The wafer assembly includes a wafer and an electrostatic carrier attached to the wafer. The electrostatic carrier is charged through the wafer cassette. The wafer cassette is transported to a next process stage. The wafer assembly is removed from the wafer cassette.

According to some embodiments, a wafer cassette includes a main body having space to hold at least one wafer assembly. Each of the at least one wafer assembly includes a wafer and an electrostatic carrier attached to the wafer. A contact part inside the main body is arranged to contact an electrical pad of the electrostatic carrier and the contact part is connected to a power supply.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A wafer cassette, comprising:
a main body having space to hold multiple wafer assemblies, wherein each of the multiple wafer assemblies includes a wafer and an electrostatic carrier attached to the wafer, the electrostatic carrier configured to hold the wafer in place by an attraction from electrostatic charges;
a first electrical contact structure inside the main body arranged to contact a first electrical pad of the electrostatic carrier, the first electrical contact structure having a first contact electrically coupled to a first terminal of a power supply; and
a second electrical contact structure inside the main body arranged to contact a second electrical pad of the electrostatic carrier, the second electrical contact structure having a second contact electrically coupled to a second terminal of the power supply.

2. The wafer cassette of claim 1, further comprising a third electrical contact structure outside the main body arranged to provide an electrical contact with a wafer cassette stage.

3. The wafer cassette of claim 2, wherein the power supply is connected to the wafer cassette stage.

4. The wafer cassette of claim 2, wherein the first electrical contact structure is connected to the third electrical contact structure.

5. The wafer cassette of claim 1, further comprising a contact housing configured to hold the multiple wafer assemblies, wherein the first electrical contact structure is attached to the contact housing.

6. The wafer cassette of claim 5, wherein the contact housing include at least one depression to hold one of the multiple wafer assemblies.

7. The wafer cassette of claim 6, wherein the first electrical contact structure comprises a spring element arranged to provide tension to hold the one of the multiple wafer assemblies.

8. The wafer cassette of claim 5, wherein the contact housing is positioned on a back of the main body and arranged to hold multiple wafer assemblies.

9. The wafer cassette of claim 1, further comprising at least one wafer supporter inside the main body for wafer assembly positioning.

10. The wafer cassette of claim 1, wherein the main body comprises polymers.

11. A wafer cassette, comprising:
a main body having space to hold at least one wafer assembly, wherein each of the at least one wafer assembly includes a wafer and an electrostatic carrier attached to the wafer, the electrostatic carrier comprising:
electrical pads;
electrodes disposed over the electrical pads, the electrodes coupled to the electrical pads; and
one or more layers of dielectric material disposed over the electrodes;
a first electrical contact structure inside the main body arranged to contact a first electrical pad of the electrostatic carrier, wherein the first electrical contact structure is connected to a first terminal of a power supply; and
a second electrical contact structure inside the main body arranged to contact a second electrical pad of the electrostatic carrier, wherein the second electrical contact structure is connected to a second terminal of the power supply.

12. The wafer cassette of claim 11, wherein the power supply is external to the main body of the wafer cassette.

13. The wafer cassette of claim 12 further comprising:
a wafer cassette stage having a third electrical contact structure, the second third contact structure being electrically connected to the power supply, the wafer cassette being on a surface of the wafer cassette stage, the wafer cassette having a fourth electrical contact structure on an outer surface of the main body, the fourth electrical contact structure contacting the second electrical contact structure.

14. The wafer cassette of claim 13, wherein the power supply is configured to charge the electrostatic carrier of the at least one wafer assembly while the at least one wafer assembly is inside the main body of the wafer cassette.

15. The wafer cassette of claim 12 further comprising:
a contact housing configured to hold the at least one wafer assembly, the first electrical contact structure inside the main body being attached to the contact housing.

16. The wafer cassette of claim 15, wherein the contact housing includes at least one depression to hold the at least one wafer assembly.

17. The wafer cassette of claim 15, wherein the first electrical contact structure inside the main body comprises a spring element configured to provide tension to hold the at least one wafer assembly.

18. The wafer cassette of claim 15, wherein the contact housing is positioned on a back of the main body and arranged to hold multiple wafer assemblies.

19. A combination wafer cassette and wafer cassette stage structure, the combination wafer cassette and wafer cassette stage structure comprising:
a wafer cassette, the wafer cassette comprising:
a main body having space to hold a plurality of wafer assemblies, each of the plurality of wafer assemblies includes a wafer and an electrostatic carrier attached to the wafer; and
a contact housing extending along a sidewall of the main body of the wafer cassette;
a plurality of first electrical contact structure pairs inside the main body and attached to the contact housing, the plurality of first electrical contact structure pairs arranged to contact electrical pad pairs of the electrostatic carriers of the plurality of wafer assemblies;
a second electrical contact structure pair outside the main body and attached to the contact housing; and
a wafer cassette stage, the wafer cassette stage comprising:
a third electrical contact structure pair, each one of the third electrical contact structure pair being electrically connected to a respective one of a terminal pair of a power supply, the wafer cassette being on a surface of the wafer cassette stage, each one of the second electrical contact structure pair of the wafer cassette being arranged to contact a respective one of the third electrical contact structure pair of the wafer cassette stage.

20. The combination wafer cassette and wafer cassette stage structure of claim 19, wherein the power supply is configured to charge the electrostatic carriers of the plurality of wafer assemblies while the plurality of wafer assemblies are inside the main body of the wafer cassette.

* * * * *